US006566190B2

(12) United States Patent
Lee et al.

(10) Patent No.: US 6,566,190 B2
(45) Date of Patent: May 20, 2003

(54) VERTICAL INTERNALLY-CONNECTED TRENCH CELL (V-ICTC) AND FORMATION METHOD FOR SEMICONDUCTOR MEMORY DEVICES

(75) Inventors: Brian S. Lee, Hsinchu (TW); John Walsh, Hsinchu (TW)

(73) Assignee: Promos Technologies, Inc., Hsinchu (TW)

(*) Notice: Subject to any disclaimer, the term of this patent is extended or adjusted under 35 U.S.C. 154(b) by 0 days.

(21) Appl. No.: 09/941,689

(22) Filed: Aug. 30, 2001

(65) Prior Publication Data

US 2003/0042524 A1 Mar. 6, 2003

(51) Int. Cl.[7] .................... H01L 29/94; H01L 31/119
(52) U.S. Cl. .................... 438/242; 438/244; 438/387; 438/391
(58) Field of Search .................. 438/212, 238, 438/241, 242, 243, 244, 268, 386, 387

(56) References Cited

U.S. PATENT DOCUMENTS

| | | | | |
|---|---|---|---|---|
| 5,744,386 A | * | 4/1998 | Kenney | 438/245 |
| 6,137,128 A | * | 10/2000 | Holmes et al. | 257/301 |
| 6,262,448 B1 | * | 7/2001 | Enders et al. | 257/302 |
| 6,362,040 B1 | * | 3/2002 | Tews et al. | 438/246 |
| 6,383,864 B2 | * | 5/2002 | Scheller et al. | 438/243 |
| 6,429,148 B1 | * | 8/2002 | Chu et al. | 438/766 |
| 6,434,041 B2 | * | 8/2002 | Forbes | 365/177 |

OTHER PUBLICATIONS

C.J. Radens et al., A 0.135 Micron 2 6F2 Trench–Sidewall Vertical Device Cell for 4Gb/16Gb DRAM. IEEE 2000, pp. 80–81.*
K. Kawamura, et al., "Gate Oxide Integrity on ITOX–SIMOX Substrates and Influence of Test Device Geometry on Characterization", IEEE Transactions on Electron Devices, vol. 48, No. 2, Feb. 2001, pp. 307–315.
K. Lee, et al., "Plasma Immersion Ion Implantation as an Alternative Deep Trench Buried–Plate Doping Technology", ITT 2000.

* cited by examiner

Primary Examiner—Wael Fahmy
Assistant Examiner—Anh Duy Mai
(74) Attorney, Agent, or Firm—Stevens, Davis, Miller & Mosher, LLP

(57) ABSTRACT

A dynamic random access memory (DRAM) device having a vertical transistor and an internally-connected strap (ICS) to connect the transistor to the capacitor. The ICS makes no direct contact with the substrate. The DRAM cell operates at a substantially lower cell capacitance than that required for a conventional buried strap trench (BEST) cell without causing any negative impact on device performance. The lower cell capacitance also extends the feasibility of deep trench capacitor manufacturing technology without requiring new materials or processing methods. A method of manufacturing the DRAM includes forming a very thin Si layer on top of a DT cell while at the same time the method forms an isolated layer replacing a conventional collar. The formation of the SOI by internal thermal oxidation (ITO) makes the structure in such a manner that the device may be fully depleted.

6 Claims, 10 Drawing Sheets

VERTICAL INTERNALLY-CONNECTED TRENCH CELL (V-ICTC) AND FORMATION METHOD FOR SEMICONDUCTOR MEMORY DEVICES

BACKGROUND OF THE INVENTION

1. Field of the Invention

The present invention relates to semiconductor memory devices and methods of manufacturing the same, and more particularly, to deep trench dynamic random access memory (DT DRAM) cells having a substantially lower cell capacitance and method of manufacturing the same.

2. Discussion of Related Art

Dynamic random access memory (DRAM) requires refreshing to maintain its stored charge. A DRAM cell operates by storing a charge on its capacitor for a logic 1 and not storing any charge for a logic 0. Stable circuit operation is achieved by having a large enough capacitor and a charge transfer device that retains the stored charge such that the signal-to-noise ratio is sufficient.

A modern deep trench DRAM (DT DRAM) device almost exclusively relies on a buried strap (BS) to electrically connect source/drain (SID) junctions to storage node electrodes. Since the BS is formed in a Si body via a p-n junction, it is leaky. This leaky connection necessitates that a high capacitance level (i.e.,>40 fF/cell) be maintained in order to amplify its signal to overcome RC noise. Typically, this high capacitance requirement has been satisfied through the use of deep trench capacitors that minimize required surface space while maintaining the charge storage capacity of the capacitor.

However, present reliance on BS technology is not satisfactory in many instances and has driven the search for new processes and materials, e.g., high-k dielectric node, DT surface enhancement, low resistance metallic fill of DT, etc. These approaches are not only expensive but are also relatively immature, and many have yet to be tried in a production environment. Further, as DRAMs are scaled down to meet higher density requirements, leakage increases make the issue of retention of charge more significant.

The minimum feature size, F, of a DRAM device is commonly referred to in the art as the ground rule (GR). To determine the area of a DRAM cell, the X-direction cell width is multiplied by the Y-direction cell width, where both dimensions are represented in terms of squared GR units, i.e., in multiples of $F^2$. In a conventional DRAM design, at least one rowline, a space between rowlines, a capacitor and a contact to device must be created within the X-direction for a total width of 4F and at least one digit line and a space between digit lines must be created in the Y-direction, yielding a minimum total cell area of $8F^2$. As the size of DRAM arrays is decreased while the density of the integrated circuits within them is correspondingly increased, new trench gates and processes to form them will be required.

As DRAM device design density requirements shrink below GR<110 nm, DT and its collar formation becomes extremely difficult. The generally held view is that at GR<100 nm, a vertical transistor is required to overcome a short-channel effect (SCE), and such a vertical transistor will enable a Sub-$8F^2$ area DT DRAM layout, in principle. However, the actual manufacturing of fully functional Sub-$8F^2$ area DRAM devices has to date been impeded by excess BS out-diffusion.

Device development has also been trending towards a fully depleted device design that improves speed and incorporates latch-up immunity. Such devices can be realized by a thin silicon-on-insulator (SOI) structure, since SOI devices are completely free of latch-up. A large amount of successful research effort has been dedicated to the formation of robust SOI applications. However, heretofore, there has not been much success in the formation of a vertical SOI structure due to the complexity of process integration.

SUMMARY OF THE INVENTION

Thus, there is a need for a fully depleted vertical cell that minimizes BS out-diffusion. The present invention discloses a fully depleted vertical cell with a direct connection between storage nodes and transistors without BS out-diffusion. The vertical-internally connected trench cell (V-ICTC) of the present invention overcomes this difficulty by naturally forming a collar during the transistor formation process so that the strap is connected inside the collar without any direct link to the Si substrate. BS out-diffusion is thereby avoided.

The present invention also provides a process integration scheme for fabricating DRAM devices that employs an internally-connected strap (ICS) structure to replace a conventional buried strap (BS) structure. The ICS directly connects a memory storage node to a source/drain (S/D) junction region of a transistor directly without forming a p-n junction in a Si body, thereby eliminating a p-n junction that is intrinsically leaky.

The ICS of the present invention enables deep trench (DT) memory cells to operate at a substantially lower cell capacitance than that required for a conventional BEST (Buried Strap Trench) cell without causing any negative impact on device performance for its low leakage characteristics. The lower cell capacitance requirement of the device of the present invention extends the feasibility of current DT capacitor manufacturing at technology without reliance on relatively untested new materials and processing methods, such as high-k dielectric node, surface enhancement, low resistance metal fill, etc., and their implementation.

The V-ICTC fabrication method of the present invention employs internal thermal oxidation (ITO), which forms embedded oxide isolation layers under an Si substrate by an angled implantation of oxygen ions followed by a thermal anneal, forming a virtual collar oxide layer. This method forms a very thin Si layer on top of a DT cell and, at the same time, forms an isolated layer in place of a conventional collar.

The SOI by ITO makes the structure in such a manner that the device may be fully depleted. The fully depleted V-ICTC device of the present invention makes it possible to design a Sub-$8F^2$ cell layout employing controlled strap formation. The V-ICTC device of the present invention is a high performance device due to its completely isolated, thin channel layer without leakage, thus improving device speed while lowering operating power requirements.

See K. Kawamura, et al., *Gate Oxide Integrity on ITOX-SIMOX Substrates and Influence on Test Device Geometry on Characterization*, IEEE Transactions on Electron Devices, Vol. 48, No. 2, February 2001, pp 307–315 and 5 Lee et al., Plasma Immersion Ion Implantation as an Alternative Deep Trench Buried Plate Doping Technology, ITT 2000, incorporated by reference herein, for a discussion of theoretical background.

BRIEF DESCRIPTION OF THE DRAWINGS

These and other advantages of the present invention will be better understood from the following detailed description of a preferred embodiment taken in conjunction with the following drawings.

DETAILED DESCRIPTION OF THE PREFERRED EMBODIMENT OF THE INVENTION

Figure 1:
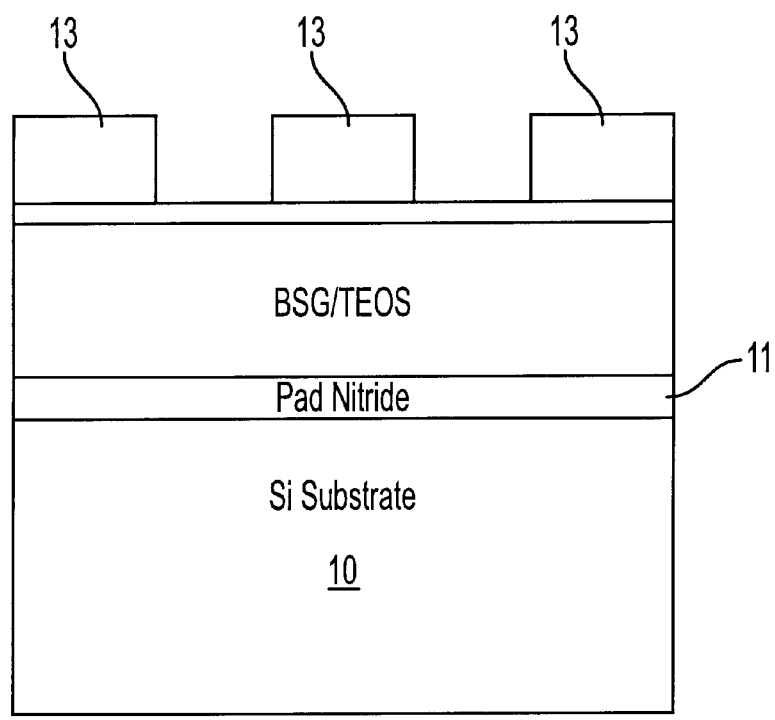
FIGS. 1 to 18 each illustrate cross sections of the inventive structure as it appears during the steps of the inventive method illustrated in the flow diagram of FIG. 19.
Figure 19:
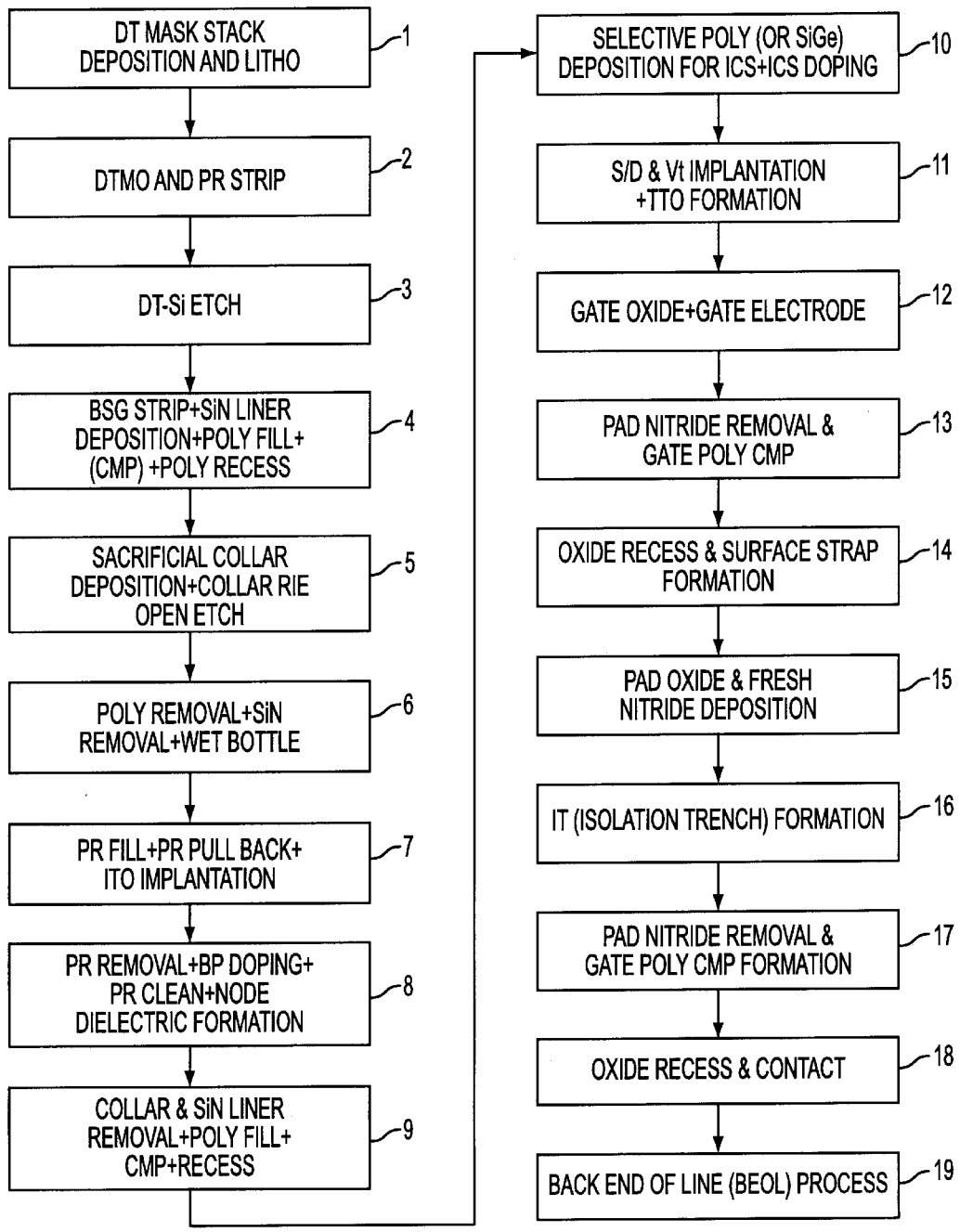
FIG. 19 is a flow diagram of the inventive method.

Referring now to the drawings, FIG. 19 shows a flow diagram of the process of the present invention. For the step in block 1 of FIG. 19 which is illustrated in FIG. 1, DT mask stack deposition and litho are performed. FIG. 1 shows silicon substrate 10, Pad nitride layer 11, a borosilica glass/tetraethylorthosilicate (BSG/TEOS) hard mask layer 12 and mask 13. DRAM fabrication requires precisely controlled quantities of impurities to be introduced into tiny regions of a silicon (Si) substrate. Subsequently, these regions must be interconnected. The patterns defining such regions are created by lithographic processes. A bilevel scheme or chemical amplification of resist lines (CARL) process may be employed. Hard anti-reflective coatings (HARC) or Poly hard mask deposition followed by a sequential pattern transfer scheme can also be used to dampen reflectivity at resist interfaces, thereby providing linewidth control with minimal loss of resist performance.

That is, a layer of photoresist material is first, for example, spin-coated onto an Si wafer substrate 10 deposited with pad nitride, hard mask layer, and ARC layer. Next, this resist is selectively exposed to a form of radiation using an exposure tool and mask 13 to effect the desired selective exposure.

Figure 2:
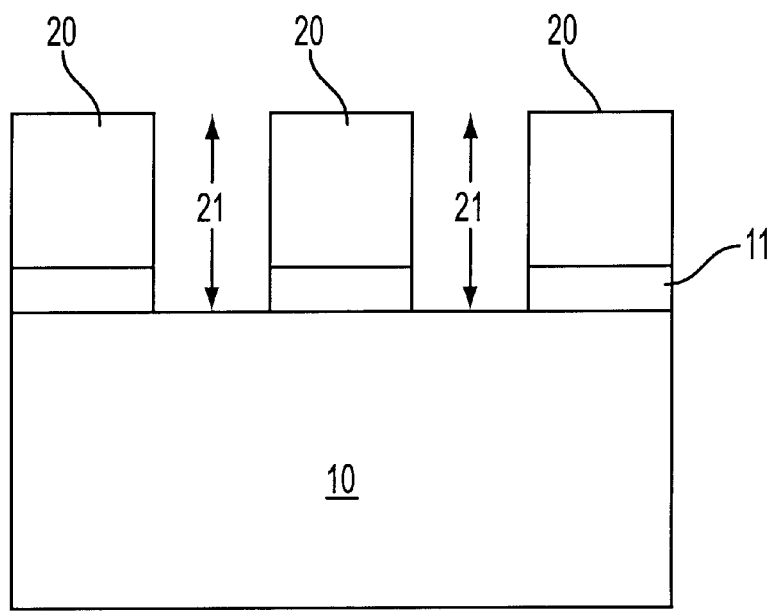

Then, for the step in block 2 that is illustrated in FIG. 2, deep trench mask open (DTMO) and polyresist (PR) strip are performed such that the patterns in the resist are transferred to hard mask layer when the wafer undergoes this pattern transfer step. The pattern transfer turns the latent image in the resist into the final image. The resist image 20 that results after pattern transfer serves as the mask in subsequent etching or ion-implantation steps. Both conventional mask open scheme and differential mask open scheme are applicable to this step. It should be noted that for a DT pattern one needs a hard mask to etch Si. Therefore, a development step is not sufficient for an image transfer process.

Figure 3:
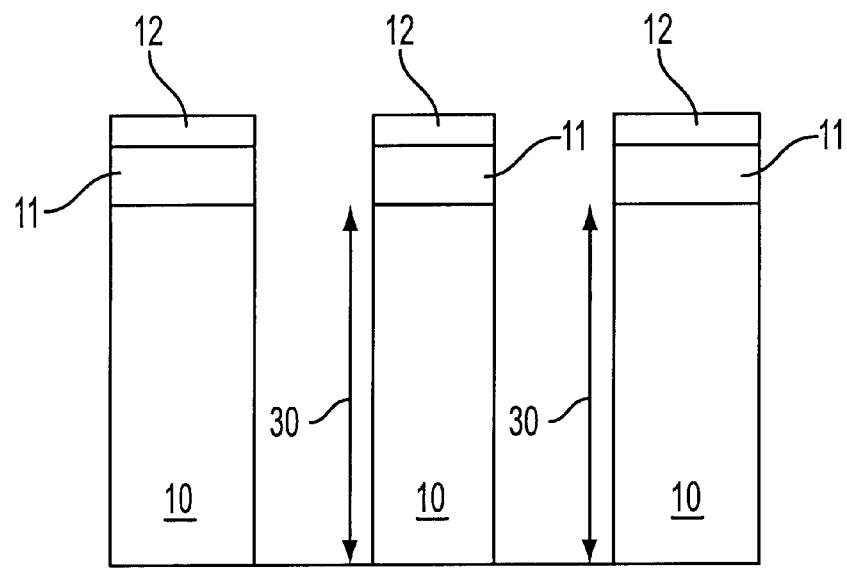

The areas of resist remaining after development protect the substrate regions that they cover. Locations from which resist has been removed are next subjected to a subtractive DTMO and DT-Si etch, for the step in block 3 which is illustrated in FIG. 3. This subtractive etch transfers the final DT pattern onto the Si substrate surface. The depth 30 of the etch for the device of the present invention may vary as a function of GR, but is about half the depth required by conventional buried strap trench (BEST) cell specs due to the lower capacitance requirement of the current invention.

Figure 4:
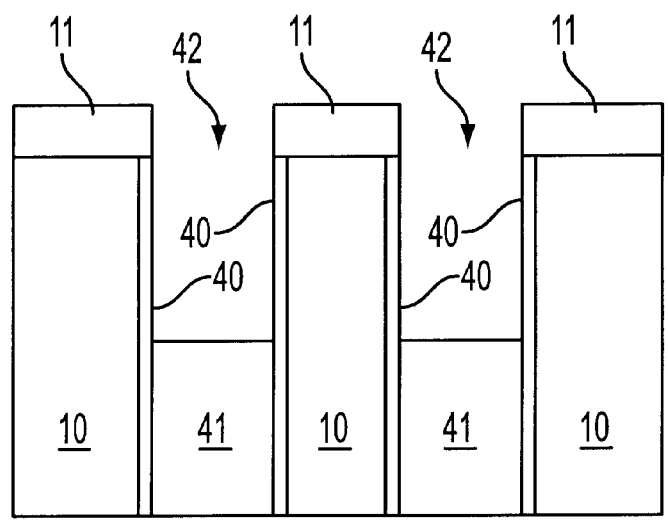

For the step in block 4 that is illustrated in FIG. 4, the BSG/TEOS layer 12 is stripped and a SiN liner 40 is deposited to protect the Si substrate 10 during subsequent Poly recess and removal. The DT is filled with a sacrificial intrinsic Poly (or amorphous Si). A chemical mechanical polishing (CMP) step is performed as an option, followed by Poly recess 42 to a depth sufficient to form a vertical transistor with an ICS.

Figure 5:
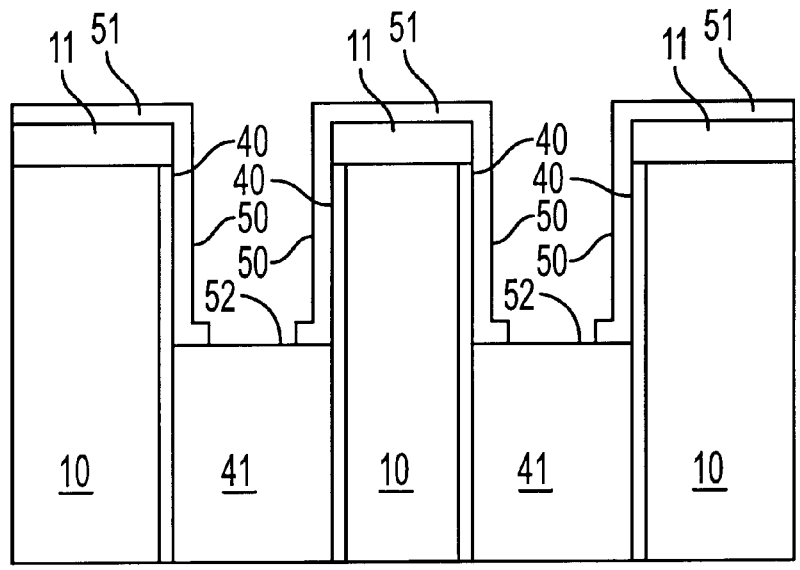

For the step in block 5 that is illustrated in FIG. 5, a sacrificial collar 51 is deposited followed by collar reactive ion etching (RIE) to open the bottom 52 of the collar 51 for a post wet process. The collar 51 and SiN liner 40 protect a top portion 50 of the trenches from erosion during wet bottle process. The collar 51 can also function as screen oxide during internal thermal oxidation (ITO) implantation and anneal steps. Ozone TEOS or low temperature oxide deposition may be used.

Figure 6:
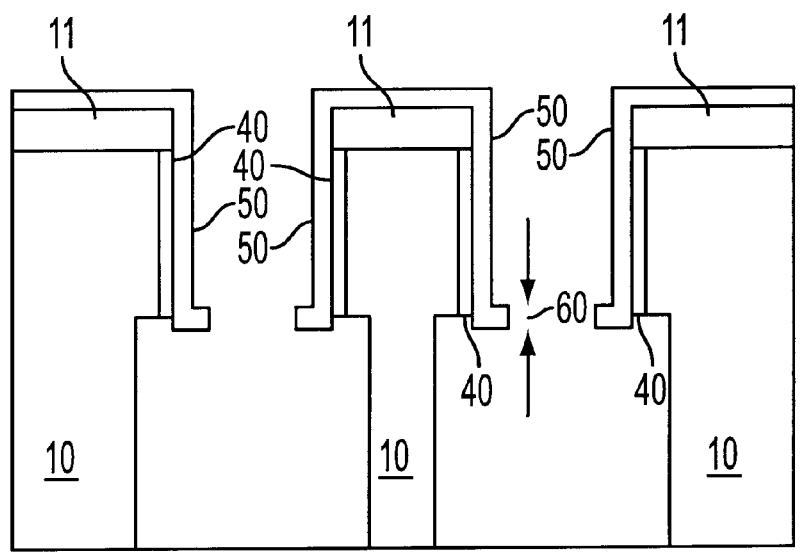

For the step of block 6 that is illustrated in FIG. 6, sacrificial poly (or amorphous Si) removal, SiN removal, and wet bottle process are performed in a manner similar to a buffered poly collar (BPC). The wet bottle process is optimized such that it covers the active SOI part. Further, in this preferred embodiment, the interface between the oxide layer and Si layer of, SOI which will be formed in a subsequent step, is uncovered in the lateral direction during the wet bottle process. For example, if the active SOI thickness 60 is 50 nm, then the wet process needs to etch more than 50 nm laterally.

Figure 7:
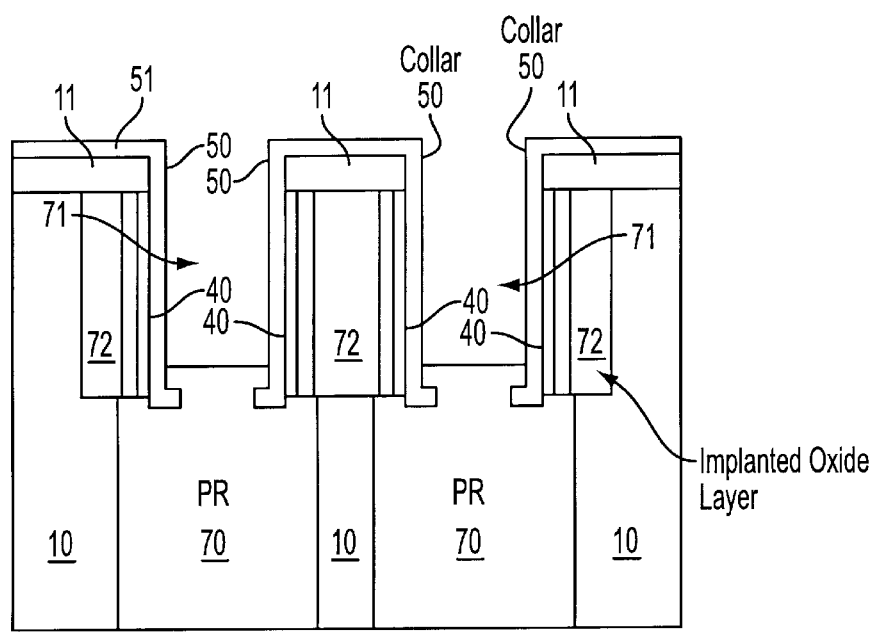

For the step of block 7 that is illustrated in FIG. 7, PR fill 70, PR pull back 71, and internal thermal oxidation (ITO) implantation 72 are performed by an angled implantation method. The recess depth is optimized such that it does not expose the bottom of the collar 51, in order to prevent excess oxidation of the DT node region. At the same time, a sufficient oxidation height of SOI is obtained which is the same depth or deeper than the collar 51. The implantation angle, energy, and depth are also optimized to meet these requirements.

Figure 8:
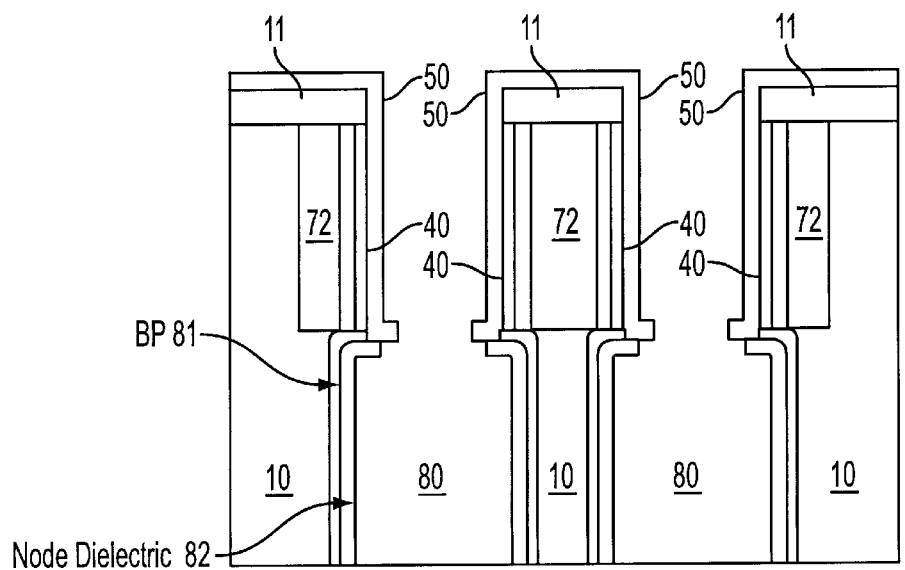

For the step of block 8 that is illustrated in FIG. 8, PR removal 80, buried plate (BP) 81 Doping, DT clean, and node dielectric 82 formation are performed. After complete removal of the PR 70, a BP doping is performed, and a Gas Phase Doping is a preferred option for its conformability and high dose capability. In an alternative embodiment, Plasma Doping may also be used but its energy should be optimized so as not to degrade the SOI by excess arsenic (As) dopant penetration into the active SOI region. A conventional NO node dielectric is formed. Alternatively, $Al_2O_3$ (A1203) or another high-k material can be integrated as a supplementary option. The effective thickness of the node dielectric 82 is determined by the operating voltage and capacitance requirement. The implanted oxygen species will be annealed agglomerating together, similarly to that of conventional Separation by Implanted Oxygen (SIMOX) processes, and damaged Si will be re-crystallized during the high temperature node dielectric process step.

Figure 9:
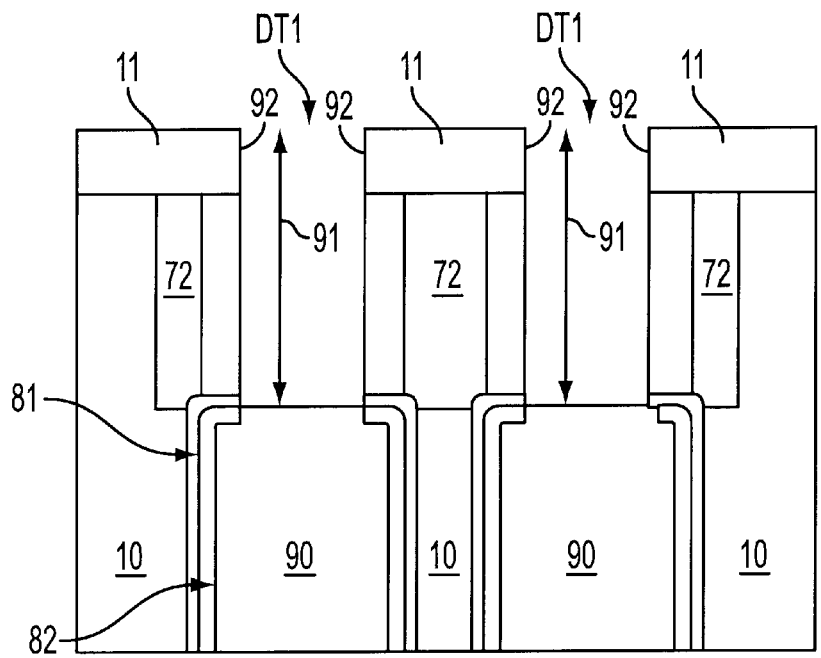

For the step of block 9 that is illustrated in FIG. 9, sacrificial collar 51 and SiN liner 40 removal, Poly-1 deposition, (CMP planarization optional), and Poly Recess-i are performed. Doped poly as a Poly-1 deposition 90 (poly fill), similar to that of a conventional DT scheme, is followed by optional CMP planarization and recess-1. The recess depth 91 must not be lower than the DT1 (top DT).

Figure 10:
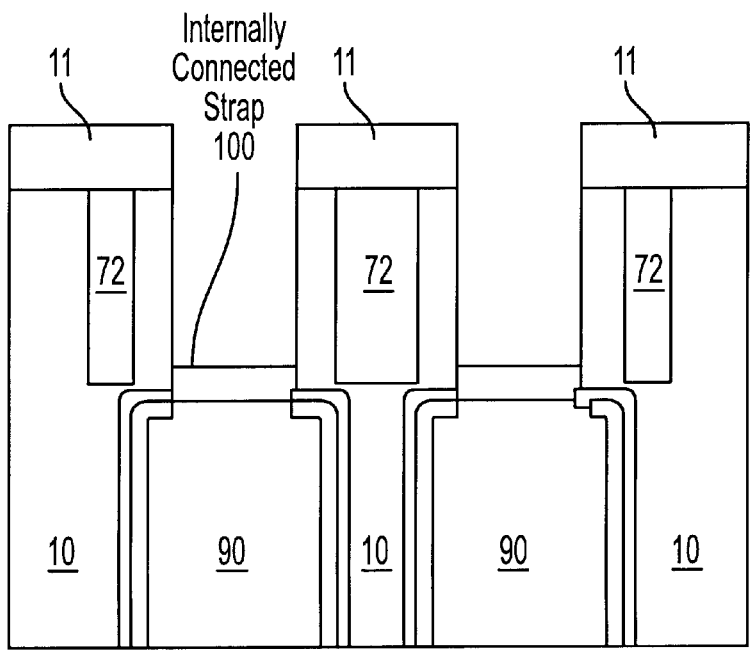

For the step of block 10 that is illustrated in FIG. 10, selective Poly (or SiGe) deposition of ICS 100 and ICS doping are performed. Both hemi-spherical grain (HSG) Poly and SiGe can be used. Additional surface amorphization steps may be needed for HSG. Both intrinsic Poly (or SiGe) followed by a separate doping step and in-situ doping can be used. In the case of in-situ doping, a deglazing step must follow immediately after the deposition step. A touch-up recess can be employed to remove any residue on the side wall 92 of DT1. The thickness of the ICS 100 deposited is optimized so as not to hamper channel engineering of the vertical cell.

Figure 11:
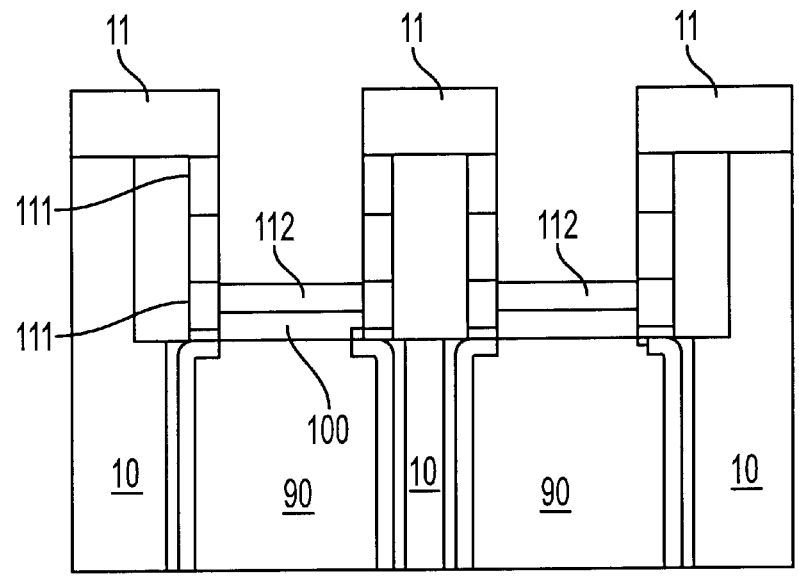

For the step of block 11 that is illustrated in FIG. 11, S/D 111 and threshold voltage ($V_t$) implantation, Trench Top Oxide (TTO) 112 formation are performed. The source/drain implantation and $V_t$ implantation steps, in an alternative embodiment, can be placed in other intervening process steps. Angled implantation for $V_t$ implantation and straight implantation for source-drain implantation can be used, respectively. The PR protects the ICS in a trench for a straight implantation.

Figure 12:
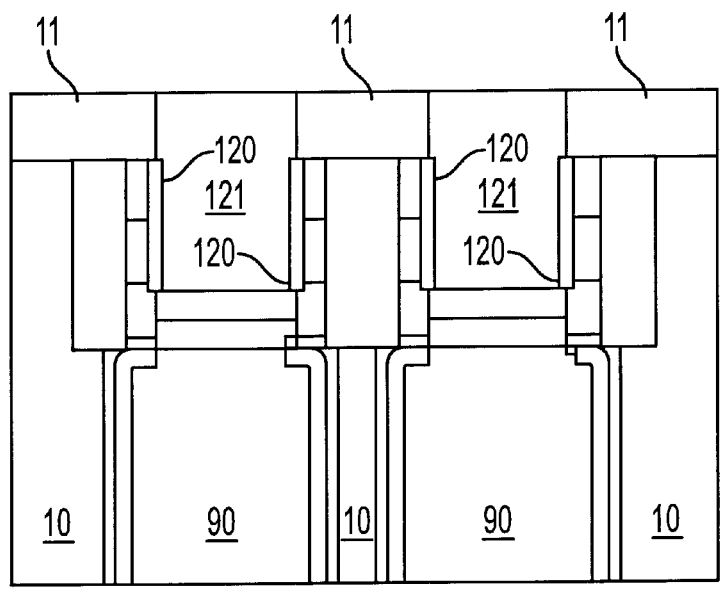

For the step of block 12, that is illustrated in FIG. 12, gate oxidation and gate electrode formation are performed. A uniform gate oxidation 120 is formed to avoid crystalline-dependent oxidation, and either surface amorphization technique or other wet oxidation can be utilized. A gate electrode 121 (or gate conductor stack) is formed by using Poly or other metallic gate electrode materials.

Figure 13:
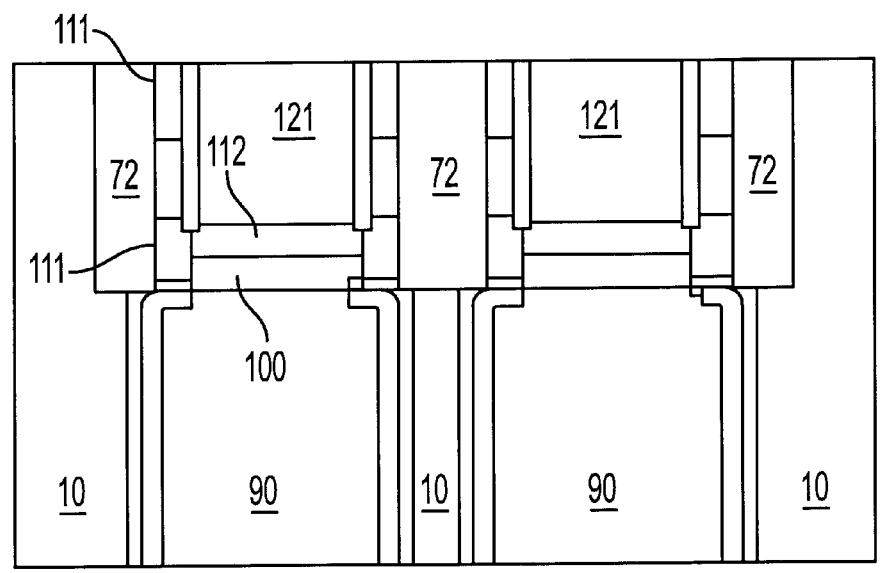

For the step of block 13 that is illustrated in FIG. 13, pad nitride 11 removal and gate poly CMP are performed. Pad nitride and oxide are removed to uncover the Si 10 and ITO implantation 72 top layers. Gate Poly 121 is polished down to the Si substrate 10 to be planarized.

Figure 14:
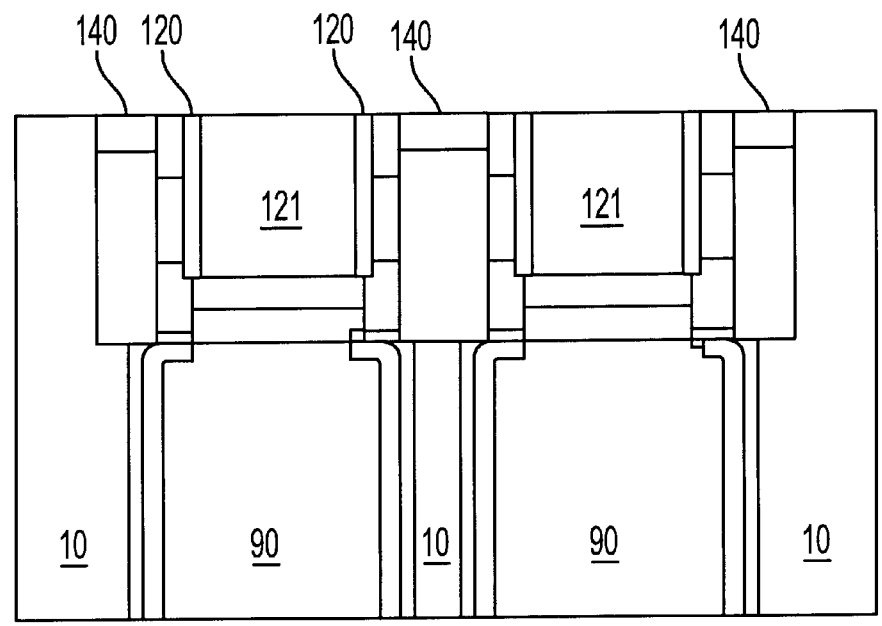

For the step of block 14 that is illustrated in FIG. 14, oxide recess and surface strap (SS) 140 formation are performed. The top SOI oxide layer 72 is removed to enable formation of a surface strap (SS) 140 to electrically connect between S/D 111 and the bit line contact (CB). The surface strap 140 is now formed by doped Poly deposition followed by a CMP planarization. The in-situ Poly doping scheme requires a deglazing step.

Figure 15:
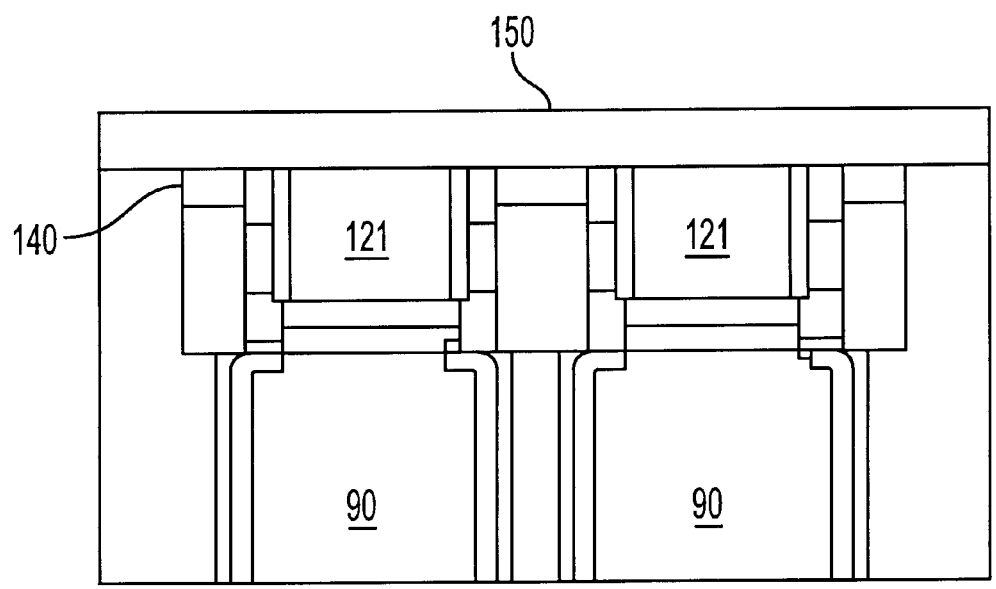

For the step of block 15 that is illustrated in FIG. 15, pad oxide and fresh nitride 150 deposition are performed.

Figure 16:
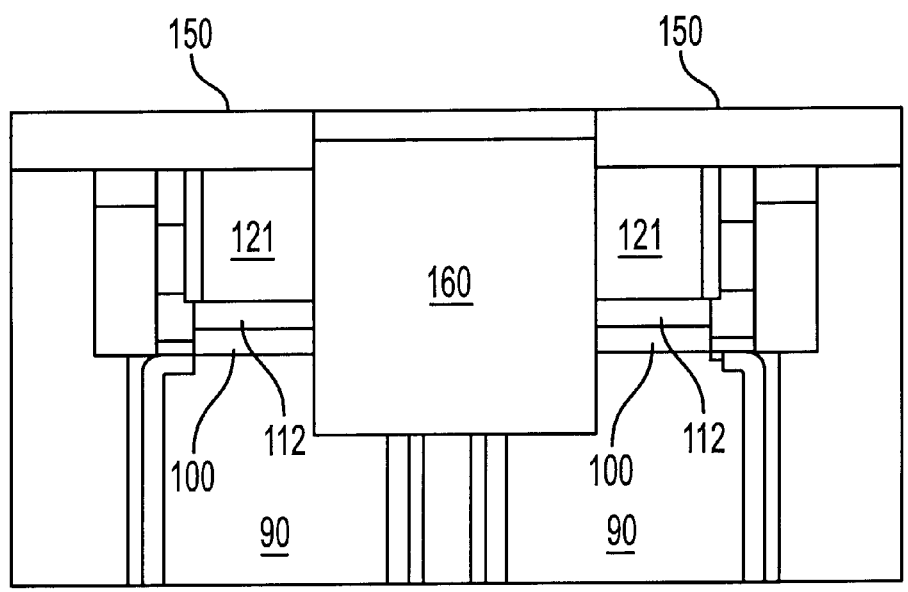

For the step of block 16 that is illustrated in FIG. 16, an isolation trench (IT) 160 is formed of depth deep enough to isolate the array device by cutting gate poly 121, TTO 112, ICS 100, and about 150 nm of Poly-1 90. The integration sequence is Litho→ITMO Etch→IT Stack Etch→Wet Clean→AA Oxidation→HDP Oxide→CMP. A sputter and etching sequence may be used to etch deep IT 160. Oxide or other hard mask may be used. The IT layout depends on device design and layout. The exemplified picture is for an $8F^2$ L/S (line/space) IT pattern.

Figure 17:
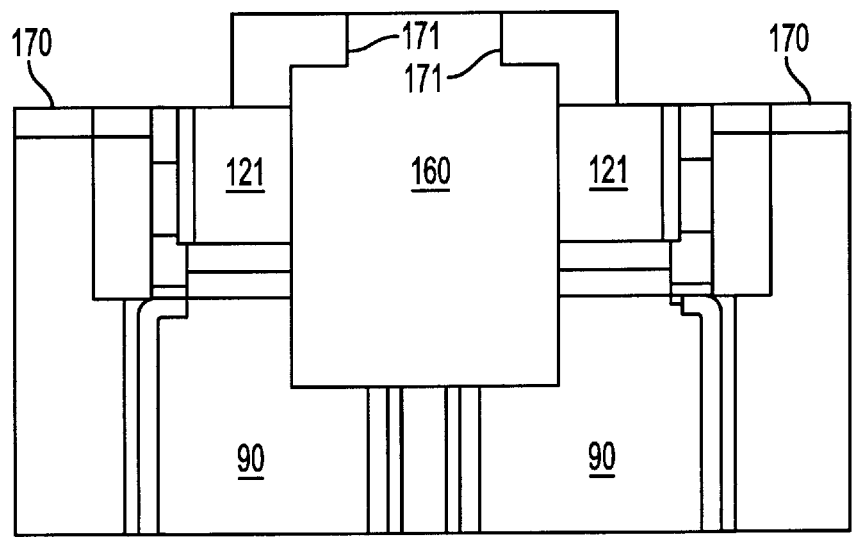

For the step of block 17 that is illustrated in FIG. 17, both a CB pad and wordline pad are formed. The CB Pad 170 is formed by implantation and anneal and the wordline pad 171 is formed by Poly L/S (line/space) studs.

Figure 18:
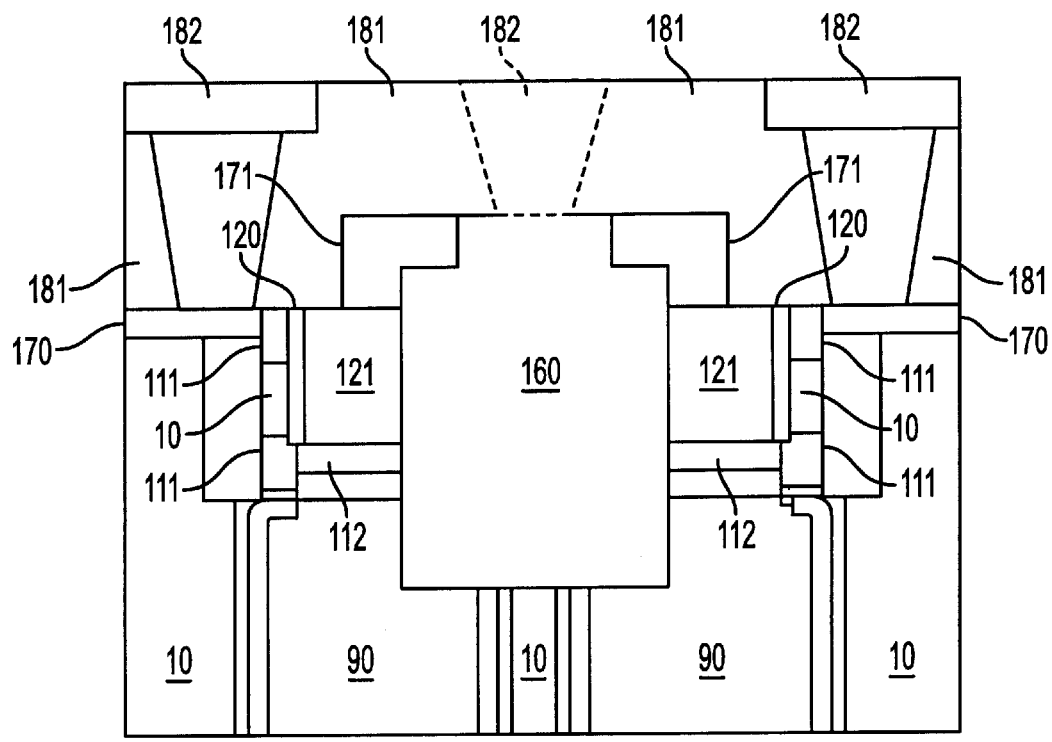

For the step of block 18 illustrated in FIG. 18, borophosphosilicate glass (BPSG) 181 deposition, CB/CS (bit line contact/common source line) etch, and MO etch are performed. Normal BPSG deposition is employed with a top TEOS layer 182. The CB/CS integrated etch for SAC (self-aligned contact) etch is followed by dedicated control gate (CG) etch. A raised contact scheme along with ion mixing can be employed. MO damascene etching and a Ti/TiN deposition by either PVD or CVD method as a barrier layer followed by thermal anneal are performed prior to deposition. A CVD W deposition is performed, preferably using a Dichlorosilane (DCS) source gas, followed by W CMP and wet clean.

Finally, a back-end-of-line (BEOL) process is performed to complete the fabrication of the DT DRAM.

While the invention has been described in terms of preferred embodiments, alternatives have been cited throughout the foregoing discussion and those skilled in the art will recognize that the invention can be practiced with modification within the spirit and scope of the appended claims.

What is claimed is:

1. A method of forming a dynamic random access memory cell having a vertical transistor with an internally connected strap without a direct link to substrate, said method comprising the steps of:

(a) transferring a pattern including a plurality of locations to a resist provided on a silicon substrate;

(b) developing the pattern transferred in step (a) to selectively remove resist;

(c) etching a deep trench in said silicon substrate at each of said plurality of locations from which resist has been removed in step (b);

(d) selectively coating sidewalls of each said deep trench etched in step (c) with a SiN liner;

(e) performing a first fill and recess, with a first deposit, of each said deep trench, said recess having a depth sufficient to form therein a vertical transistor with an internally connected strap;

(f) depositing a collar around a periphery of each said deep trench and opening a bottom of the collar in each said deep trench such that a depth of each said collar is the same;

(g) removing said first deposit from each said deep trench, cleaning said SiN liner, and then performing a wet process to etch each said deep trench laterally;

(h) performing a second fill and recess, with a second deposit, of each said deep trench, said recess of said second fill and recess having a depth such that a bottom portion of the collar is covered;

(i) implanting an oxide layer behind the SiN liner in a top portion of said Si substrate that surrounds each said deep trench, said oxide layer having a depth at least equal to said depth of said collar;

(j) removing said second deposit;

(k) selectively doping a buried plate on a lower portion of sidewalls of each said deep trench, by driving said dopant into said substrate at said lower portion;

(l) cleaning each said deep trench;

(m) forming a node dielectric on said lower portion of said sidewalls of each said deep trench;

(n) removing said collar and said SiN liner from an upper portion of said sidewalls of each said deep trench;

(o) performing a third fill and recess, with a third deposit, in each said deep trench such that said recess of said third fill and recess is less than a height of said upper portion of said sidewalls in each said deep trench;

(p) depositing a doped internally connected strap on a top portion of said third deposit in each said deep trench;

(q) performing source/drain and threshold voltage implantation into a substrate surface at said upper portion of said sidewalls of each deep trench;

(r) forming trench top oxide on a top portion of said internally connected strap in each said deep trench;

(s) forming a gate oxide along exposed sidewalls of each said deep trench; and (t) positioning a gate electrode within each said deep trench.

2. A method according to claim 1, wherein step (i) is accomplished by an internal thermal oxidation step.

3. A method according to claim 1, further comprising the step of:

forming a recessed surface strap on said memory cell to electrically connect to said source/drain.

4. A method according to claim 1, further comprising the step of:

forming an isolation trench between said deep trenches, said isolation trench having a depth sufficient to isolate an array device of which said memory cell is a part, said isolation trench having a layout dependent on memory cell design and layout.

5. A method according to claim 1, further comprising the step of:

implanting a bit line contact pad on said substrate surface and connected with said recessed surface strap; and forming a word line contact pad in contact with said gate electrode.

6. A method according to claim 1, further comprising the steps of:

(u) planarizing said memory cell to generate an uncovered planarized substrate surface, uncovered planarized implanted oxide layers, and a planarized gate electrode surface, wherein said gate electrode is at a level of the uncovered substrate surface;

(v) forming a recessed surface strap in a top portion of said uncovered implanted oxide layer to electrically connect to said source/drain;

(w) depositing a pad oxide and nitride on said memory cell;

(x) forming an isolation trench between said deep trenches, said isolation trench having a depth sufficient to isolate an array device of which said memory cell is a part, said isolation trench having a layout dependent on memory cell design and layout;

(y) implanting a bit line contact pad on said uncovered substrate surface connected with said recessed surface strap; and forming a word line contact pad in contact with said planarized gate electrode surface; and (z) forming contacts on said bit line contact pad and said word line contact pad.

* * * * *